(12) United States Patent
Tsuji et al.

(10) Patent No.: US 7,075,123 B2
(45) Date of Patent: Jul. 11, 2006

(54) SEMICONDUCTOR INPUT PROTECTION CIRCUIT

(75) Inventors: Nobuaki Tsuji, Hamamatsu (JP); Masao Noro, Hamamatsu (JP); Terumitsu Maeno, Iwata (JP); Seiji Hirade, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/968,685

(22) Filed: Oct. 19, 2004

(65) Prior Publication Data

US 2005/0051847 A1  Mar. 10, 2005

Related U.S. Application Data

(62) Division of application No. 09/982,335, filed on Oct. 18, 2001, now Pat. No. 6,847,059.

(30) Foreign Application Priority Data

Oct. 18, 2000 (JP) .............................. 2000-317557

(51) Int. Cl.
*H01L 29/74* (2006.01)
*H01L 23/62* (2006.01)

(52) U.S. Cl. ...................... 257/173; 257/355; 257/362; 257/363

(58) Field of Classification Search ........ 257/173–174, 257/355–363
See application file for complete search history.

(56) References Cited

U.S. PATENT DOCUMENTS

| 3,955,210 A | 5/1976 | Bhatia et al. ................ 257/373 |
| 4,168,442 A | 9/1979 | Satou et al. ................. 327/310 |
| 4,288,804 A | 9/1981 | Kikuchi et al. ............. 257/373 |
| 4,760,433 A | 7/1988 | Young et al. ................ 257/357 |
| 5,477,413 A | 12/1995 | Watt ............................. 361/56 |
| 5,747,837 A | 5/1998 | Iwase et al. ................. 257/173 |
| 5,905,679 A | 5/1999 | Tsukikawa ............. 365/189.06 |
| 6,281,527 B1 | 8/2001 | Chen ......................... 257/168 |
| 6,570,226 B1 | 5/2003 | Groeseneken et al. ...... 257/361 |

FOREIGN PATENT DOCUMENTS

| EP | 0822596 A2 | 2/1998 |
| JP | 58-061646 | 4/1983 |
| JP | 58-186959 | 11/1983 |
| JP | 03-023662 | 1/1991 |
| JP | 04-079379 | 3/1992 |

*Primary Examiner*—Ori Nadav
(74) *Attorney, Agent, or Firm*—Pillsbury Winthrop Shaw Pittman LLP

(57) ABSTRACT

A lateral PNP transistor PB and a lateral NPN transistor NB are serially connected between an input terminal and a reference potential (ground potential). In the transistor PB, a diode $D_1$ is formed. In the transistor NB, a diode $D_3$ is formed. When an ESD of +2000 V is input, the transistor NB turns on, whereas when an ESD of −2000 V is input, the transistor PB turns on. The level of a positive signal capable of being input is limited by the inverse breakdown voltage (e.g., 18 to 50 V) of the diode $D_3$, whereas the level of a negative signal capable of being input is limited by the inverse breakdown voltage (e.g., 13 to 15 V) of the diode $D_1$.

4 Claims, 11 Drawing Sheets

SEMICONDUCTOR INPUT PROTECTION CIRCUIT

RELATED APPLICATIONS

This application is a divisional application of application Ser. No. 09/982,335, filed Oct. 18, 2001, now U.S. Pat. No. 6,847,059.

This application is based on and claims priority on Japanese patent application 2000-317557, filed on Oct. 18, 2000, the whole contents of which are incorporated herein by reference.

BACKGROUND OF THE INVENTION

1. Field of the Invention

The present invention relates to an input protection circuit for protecting an input circuit portion of an integrated circuit device such as CMOSIC from breakdown by electrostatic discharge (ESD) or the like.

2. Description of the Related Art

A conventional input protection circuit used for CMOSIC or the like has a MOS transistor whose drain is connected to an input terminal of CMOSIC or the like and whose gate and source are connected to the ground potential. The gate insulating film of the MOS transistor of such an input protection circuit has a low breakdown voltage of about 10 V so that an ESD breakdown voltage is low.

An input protection circuit having a higher ESD breakdown voltage has been proposed such as shown in FIGS. 10 and 11. In FIGS. 10 and 11, reference characters IN represent an input terminal from which an input signal is supplied to a circuit to be protected.

In the circuit shown in FIG. 10, in one principal surface area of a p-type silicon substrate 1, a p-type well region 2 is formed in which n-type well regions 3 and 4 are formed. A MOS transistor is formed by the n-type well regions 3 and 4 and a channel made of a portion of the p-type well region 2. The bottoms of both the n-type well regions 3 and 4 form PN junctions with the substrate 1. In the well regions 3 and 4, n⁺-type impurity doped regions 5 and 6 are formed to provide contact regions, and in the p-type well region 2, a p⁺-type impurity doped region 7 is formed to provide a contact region.

On the principal surface of the substrate 1, a field insulating film 8 made of silicon oxide or the like is formed. On the insulating film 8 above the channel region between the well regions 3 and 4, a gate electrode layer 9 made of polysilicon or the like is formed. The impurity doped region 5 and gate electrode layer 9 are connected to the input terminal IN. The impurity doped regions 6 and 7 are both connected to the ground potential.

FIG. 11 is an equivalent circuit diagram of the integrated circuit structure shown in FIG. 10. The drain and gate (well region 3 and gate electrode layer 9 shown in FIG. 10) of an n-channel MOS type transistor FT are connected to the input terminal IN. The source (well region 4 shown in FIG. 10) of the transistor FT is connected to the ground potential. A diode D is formed between the well region 3 and substrate 1, the cathode and anode thereof being connected to the input terminal IN and ground potential, respectively. An NPN type lateral bipolar transistor BT is made of the well regions 3 and 4 and a p-type region (a portion of the well region 2) between the well regions 3 and 4, the collector and emitter thereof being connected to the input terminal IN and ground potential, respectively. Between the base and emitter of the transistor BT, a resistor R made of the resistance components of the substrate is connected. The well region 2 and substrate 1 are connected to the ground potential.

When an ESD input of +V is applied to the input terminal IN, the transistor FT turns on to protect a subject circuit CP to be protected. Since the thick field insulating film 8 is used as the gate insulating film of the transistor FT, it has a high ESD breakdown voltage. In this specification, the term "ESD input" is intended to mean "a surge voltage input caused by static electricity or the like".

The diode D is made of a PN junction between well regions 3 and 2 and between the well region 3 and substrate 1 (i.e., PN junctions formed between low impurity concentration regions) so that it has a high inverse breakdown voltage of about 50 V. The level of a positive signal capable of being input to the subject circuit to be protected is limited by the inverse breakdown voltage of the diode D. When an ESD input of −V is applied to the input terminal IN, the diode D turns on to protect the subject circuit CP to be protected.

In the field of audio circuits, CMOSIC is generally required to process a signal in the range from +15 V to −15 V. With the conventional circuit described above, although a +15 V input signal can be processed, a −15 V input signal cannot be input because a negative input signal turns on the diode D.

SUMMARY OF THE INVENTION

It is an object of the present invention to provide a novel input protection circuit having a high ESD breakdown voltage and being capable of inputting positive and negative input signals in a broad input signal level range.

According to one aspect of the present invention, there is provided an input protection circuit comprising: an input terminal for supplying an input signal to a circuit to be protected; a semiconductor substrate of a first conductivity type; a first well region of a second conductivity type opposite to the first conductivity type, the first well region being formed in one principal surface area of the semiconductor substrate and forming a PN junction with the semiconductor substrate; first and second impurity doped regions of the first conductivity type formed in the first well region and forming a first lateral bipolar transistor with a portion of the first well region serving as a base; a second well region of the first conductivity type formed in the principal surface area of the semiconductor substrate; and third and fourth well regions of the second conductivity type formed in the second well region and forming a second lateral bipolar transistor with a portion of the second well region serving as a base, bottoms of the third and fourth well regions forming a PN junction with the second well or with the semiconductor substrate, wherein the input terminal is connected to the first impurity doped region, the second impurity doped region and the base of the first lateral bipolar transistor are connected to the third well region, and the fourth well region and the base of the second lateral bipolar transistor are connected to a reference potential.

If the first and second conductivity types of the input protection circuit are p- and n-types, respectively, when an ESD input of +V is applied, the second lateral bipolar transistor turns on, whereas when an ESD input of −V is applied, the first lateral bipolar transistor turns on. The circuit can be protected from an ESD input of, e.g., ±2000 V. The level of a positive signal capable of being input is limited by the inverse breakdown voltage of a PN junction diode formed between the second and third well regions (or between the second well region and semiconductor substrate). Since the PN junction is formed in the well regions having a low impurity concentration, the inverse breakdown voltage of the diode can be set to, for example, about 50 V. The level of a negative signal capable of being input is limited by the inverse breakdown voltage of a PN junction diode formed between the first impurity doped region and first well region. The inverse breakdown voltage of the diode can be set to, for example, about 15 V. It is therefore possible to input a signal in the range from +15 V to −15 V.

In the input protection circuit, a current limiting resistor may be formed on an insulating layer formed on the principal surface of the semiconductor substrate to connect the input terminal to the first impurity doped region via the current limiting resistor. Thermal breakage of transistors and diodes constituting the input protection circuit can be avoided.

In the input protection circuit, the first and second lateral transistors may be exchanged.

According to another aspect of the present invention, there is provided an input protection circuit comprising: an input terminal for supplying an input signal to a circuit to be protected; a semiconductor substrate of a first conductivity type; a first well region of a second conductivity type opposite to the first conductivity type, the first well region being formed in one principal surface area of the semiconductor substrate and forming a PN junction with the semiconductor substrate; first and second impurity doped regions of the first conductivity type formed in the first well region and forming a first lateral bipolar transistor with a portion of the first well region serving as a base; and second and third well regions of the second conductivity type formed in the principal surface area of the semiconductor substrate, the second and third well regions forming a second lateral bipolar transistor with a portion of the semiconductor substrate serving as a base, wherein the input terminal is connected to the first impurity doped region, the second impurity doped region and the base of the first lateral bipolar transistor are connected to the second well region, and the third well region and the base of the second lateral bipolar transistor are connected to a reference potential.

In this input protection circuit, the second well region of the input protection circuit described earlier is omitted. This input protection circuit can have similar operations and advantages to those of the input protection circuit described earlier. One of two PN junction diodes which determine the range of a signal level capable of being input, is formed between the second well region and semiconductor substrate. Therefore, the inverse breakdown voltage of this diode can be raised and the range of a signal level capable of being input can be broadened further.

In the input protection circuit, a current limiting resistor may be formed on an insulating layer formed on the principal surface of the semiconductor substrate to connect the input terminal to the first impurity doped region via the current limiting resistor. Thermal breakage of transistors and diodes constituting the input protection circuit can be avoided.

Similar to the input protection circuit described earlier, the first and second lateral transistors may be exchanged.

As above, an input protection circuit having a high ESD breakdown voltage of ±2000 V and being capable of inputting a signal in a broad input signal level range of ±15 V can be provided. An integrated circuit device used in the field of audio circuits or the like can be protected reliably.

DESCRIPTION OF THE PREFERRED EMBODIMENTS

Figure 1:
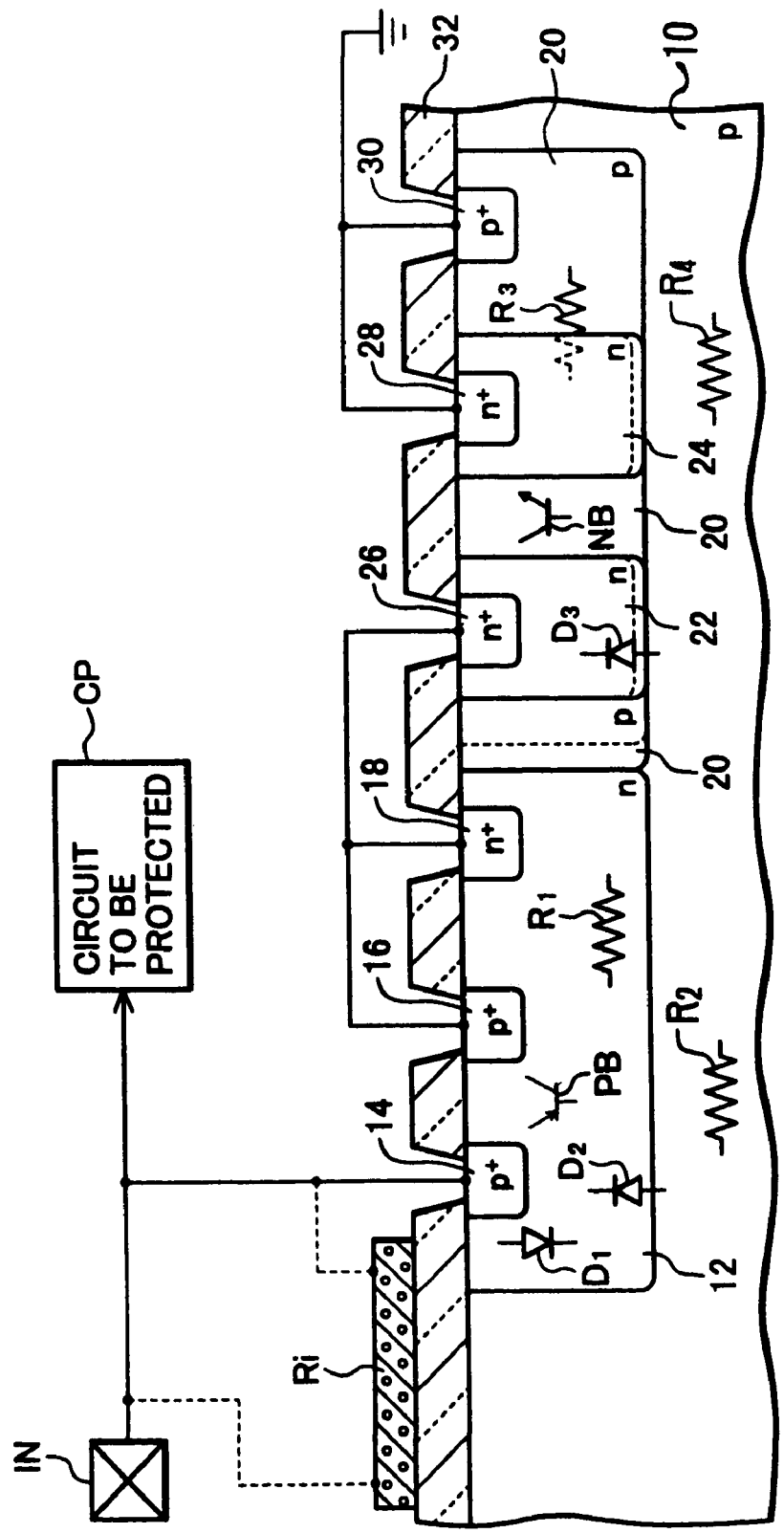
FIG. 1 is a cross sectional view of a substrate showing an integrated structure of an input protection circuit according to an embodiment of the invention.

FIG. 1 shows the integrated structure of an input protection circuit according to an embodiment of the invention.

A p-type semiconductor substrate 10 made of, e.g., silicon, has a relatively low impurity concentration (e.g., $10^{15}$ $cm^{-3}$ or lower) and has an n-type well region 12 formed in its one principal surface area. The well region 12 has a relatively low impurity concentration (e.g., $4\times10^{16}$ to $1\times10^{17}$ $cm^{-3}$) and is formed by selective ion implantation or the like, forming a PN junction with the substrate 10.

In the well region 12, $p^+$-type impurity doped regions 14 and 16 are formed to form a PNP type lateral bipolar transistor PB with a portion of the well region 12 serving as its base. The impurity doped regions 14 and 16 have a relatively high impurity concentration (e.g., 1 to $5\times10^{21}$ $cm^{-3}$) and is formed by selective diffusion, selective ion implantation or the like.

In the well region 12, an $n^+$-type impurity doped region 18 for providing an ohmic contact is formed. The impurity doped region 18 has a relatively high impurity concentration and is formed by selective diffusion, selective ion implantation or the like.

In the principal surface area of the substrate 10, a p-type well region 20 is formed having a relatively low impurity concentration (e.g., $4\times10^{16}$ to $1\times10^{17}$ $cm^{-3}$). Although this well region 20 is shown to have a PN junction at its side with the well region 12, it may be formed spaced apart from the well region 12, as shown by a broken line.

In the well region 20, n-type well regions 22 and 24 are formed to form an NPN type lateral bipolar transistor NB with a portion of the well region 20 serving as its base. The well regions 22 and 24 have a relatively low net impurity concentration (e.g., $4\times10^{16}$ to $1\times10^{17}$ $cm^{-3}$) and is formed by selective ion implantation or the like, which over-compensates the impurity concentration of the well 20, forming a PN junction with the substrate 10. The well regions 22 and 24 can be formed by the same process as the process of forming the well region 12. Although both the well regions 22 and 24 form PN junctions with the well region 20 and substrate 10, they may be formed to have the PN junctions only with the well region 20 (to have the PN junction not with the substrate 10 but only with the well region 20 at the bottoms of the well regions 22 and 24, as shown by broken lines).

In the well regions 22 and 24, $n^+$-type impurity doped regions 26 and 28 are formed to provide ohmic contacts. Both the impurity doped regions 26 and 28 have a relatively high impurity concentration and can be formed by utilizing the same process as that of forming the impurity doped region 18. If impurity doped regions are formed by the same process in regions having different conductivity types and impurity concentrations, the impurity concentrations and impurity doped depths of the regions formed by the same process are different more or less. However, these slightly different concentrations and depths may be expressed as "substantially the same".

In the well region 20, a $p^+$-type impurity doped region 30 is formed for providing an ohmic contact. The impurity doped region 30 has a relatively high impurity concentration and is formed by utilizing the same process as that of forming the impurity doped regions 14 and 16.

The principal surface of the substrate 10 is covered with an insulating film 32 including a field insulating film of silicon oxide or the like. Wiring apertures are formed through the insulating film 32 as shown in FIG. 1. The impurity doped region 14 is connected to an input terminal IN. The impurity doped regions 16 and 18 are connected to the impurity doped region 26. The impurity doped regions 28 and 30 are connected to a reference potential level (ground level).

Figure 2:
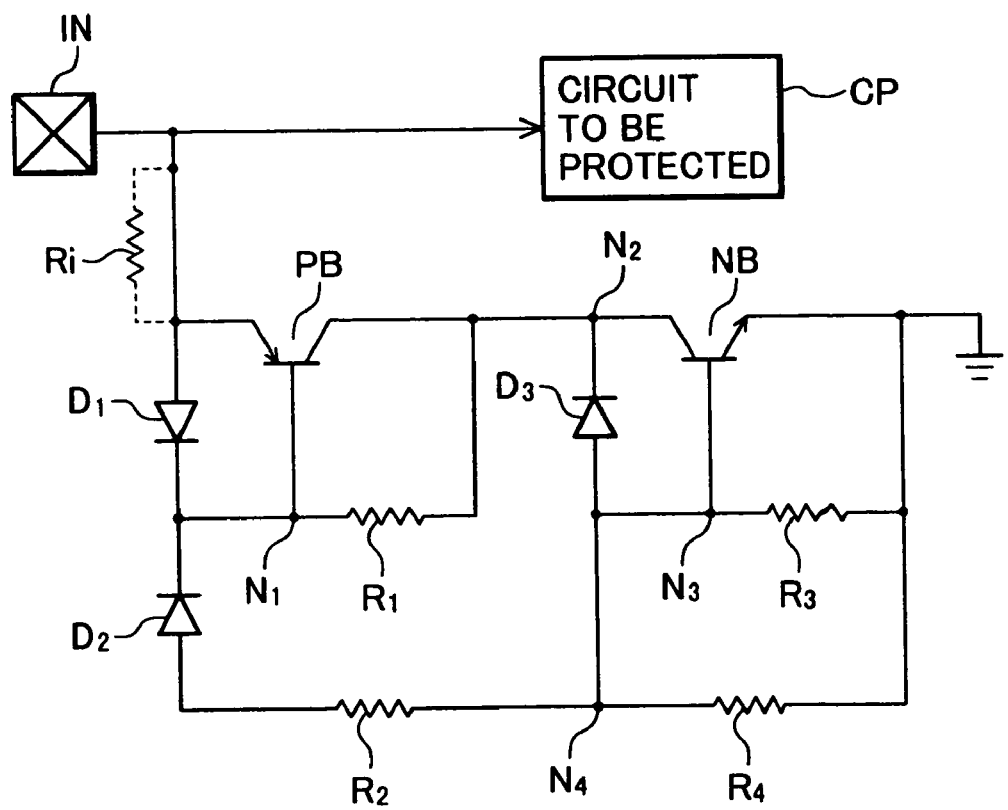
FIG. 2 is an equivalent circuit diagram of the integrated structure shown in FIG. 1.

FIG. 2 is an equivalent circuit diagram of the integrated structure shown in FIG. 1. The emitter (impurity doped region 14) of the PNP transistor PB is connected to the input terminal IN. The collector (impurity doped region 16) of the transistor PB is connected to the collector (well region 22) of the NPN transistor NB, and the base of the transistor PB is connected to the collector of the transistor NB via a resistor $R_1$ made of the resistance component of the well region 12. A connection point between the base of the transistor PB and the resistor $R_1$ is represented by a node $N_1$. The anode and cathode of a diode $D_1$ formed between the impurity doped region 14 and well region 12 are connected to the emitter and base of the transistor PB, respectively.

The emitter (well region 24) of the transistor NB is connected to the reference potential level, and the base of the transistor NB is connected to the reference potential level via a resistor $R_3$ made of the resistance component of the well region 20. The cathode and anode of a diode $D_3$ made of a PN junction between the well region 22 and well region 20 and between the well region 22 and substrate 10 are connected to the collector and base of the transistor NB, respectively. A connection point between the cathode of the diode $D_3$ and the collector of the transistor NB is represented by a node $N_2$ and a connection point between the base of the transistor NB and the resistor $R_3$ is represented by a node $N_3$.

The cathode of a diode $D_2$ made of a PN junction between the well region 12 and substrate 10 is connected to the cathode of the diode $D_1$, and the anode of the diode $D_2$ is connected to the anode of the diode $D_3$ via a resistor $R_2$ made of the resistance component of the substrate 10, and to the ground level via a resistor $R_4$ made of the resistance component of the substrate 10 and p-type well 20. A connection point between the resistors $R_2$ and $R_4$ is represented by a node $N_4$.

Figure 3:
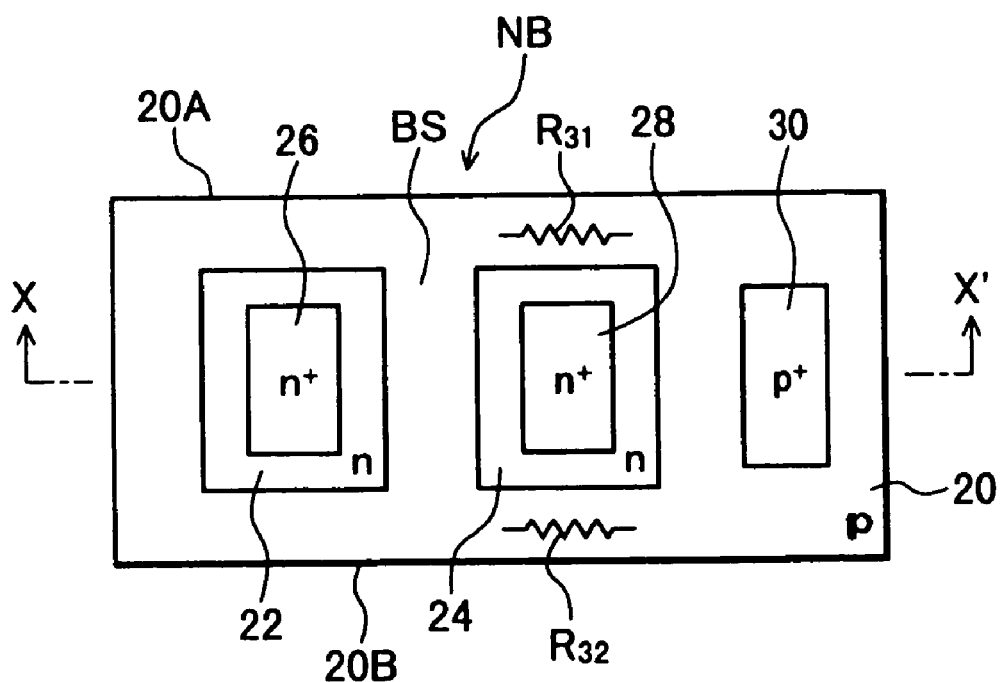
FIG. 3 is a top view showing an example of the emitter-base-collector layout of an NPN type transistor.

The equivalent circuit of the transistor NB shown in FIG. 2 has an emitter-base-collector layout shown in FIG. 3. A cross sectional view taken along line X–X' shown in FIG. 3 corresponds to the cross sectional view of the well region 20 shown in FIG. 1.

In the transistor NB shown in FIG. 3, the n-type well regions 22 and 24 are formed inward spaced apart from two sides 20A and 20B of the p-type well region 20, and have the $n^+$-type impurity doped regions 26 and 28 inside the well regions 22 and 24. There are resistance components $R_{31}$ and $R_{32}$ corresponding to the resistor $R_3$ shown in FIG. 2, between the $p^+$-type impurity doped region 30 as a base contact region and the p-type base region between the well regions 22 and 24.

Figure 4:
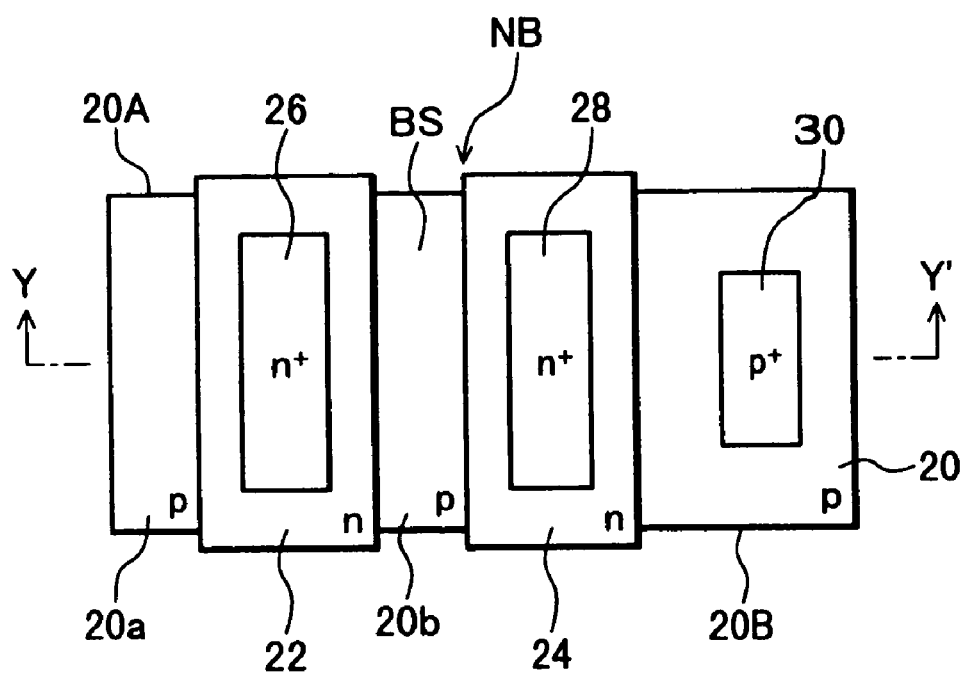
FIG. 4 is a top view showing another example of the emitter-base-collector layout of an NPN type transistor.

The emitter-base-collector layout of the transistor NB may use a layout shown in FIG. 4. A cross sectional view taken along line Y–Y' shown in FIG. 4 corresponds to the cross sectional view of the well region 20 shown in FIG. 1.

In the transistor NB shown in FIG. 4, the n-type well regions 22 and 24 are formed to extend outward from the two sides 20A and 20B of the p-type well region 20, to form a PN junction with the substrate. The n-type well regions 22 and 24 have therein the $n^+$-type impurity doped regions 26 and 28, respectively. Well regions 20a and 20b may be separated from the well region 20 by the well regions 22 and 24 having the above-described pattern.

Figure 5:
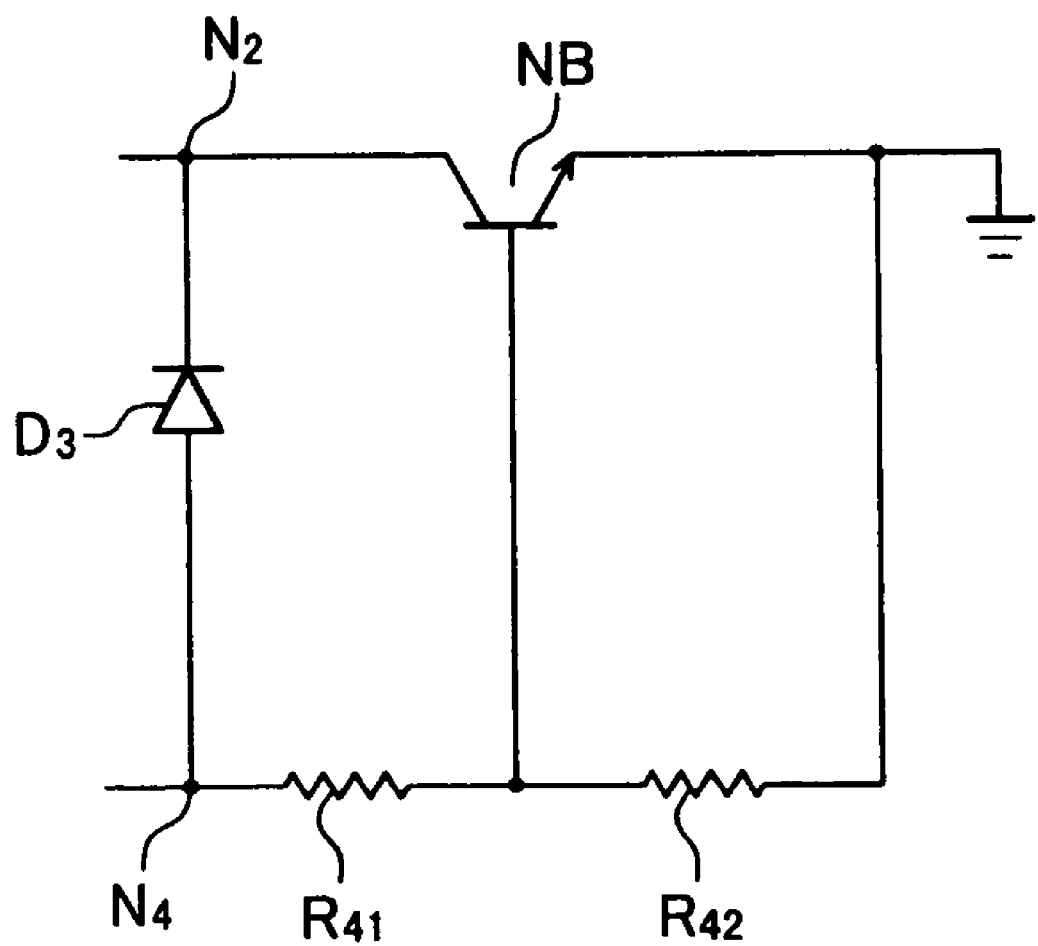
FIG. 5 is an equivalent circuit diagram of an NPN type transistor having the layout shown in FIG. 4.

FIG. 5 is an equivalent circuit diagram of the transistor NB having the layout shown in FIG. 4. In FIG. 5, like elements to those shown in FIG. 2 are represented by like reference symbols. There is a resistor $R_{41}$ made of the resistance component of the substrate 10, between the base region BS of the p-type well region 20b between the n-type well regions 22 and 24 and the anode of the diode $D_3$. There is a resistor $R_{42}$ made of the resistance component of the substrate 10, between the base region BS and the p-type impurity doped region 30 serving as the base contact region.

In the input protection circuit shown in FIGS. 1 and 2, when an ESD input of, e.g., +2000 V is applied to the input terminal, the diode $D_1$ turns on and a backward voltage is applied across the diode $D_3$ via the node $N_1$, resistor $R_1$ and node $N_2$. When this backward voltage exceeds the inverse breakdown voltage of the diode $D_3$, the base current of the transistor NB increases. Therefore, the transistor NB turns on and a large current flows. The voltage at the input terminal IN lowers at an instant to +10 to +20 V to protect the subject circuit CP to be protected.

If the circuit shown in FIG. 5 is used, the backward current of the diode $D_3$ flows through the node $N_4$, and resistors $R_{41}$ and $R_{42}$, and the base current of the transistor NB increases. Therefore, the transistor NB turns on and a large current flows. The protection operation similar to the circuit shown in FIG. 2 can therefore be performed.

When an ESD input of, e.g., −2000 V is applied to the input terminal IN, a forward voltage is applied across the diode $D_3$ via the resistor $R_3$ and node $N_3$ so that the diode $D_3$ turns on. A backward voltage is applied across the diode $D_1$ via the node $N_2$, resistor $R_1$ and node $N_1$. In this case, the emitter and collector of the transistor NB shown in FIG. 2 become the collector and emitter, respectively. When the voltage across the diode $D_1$ exceeds the inverse breakdown voltage of the diode $D_1$, the backward current of the diode $D_1$ flows through the resistor $R_1$ and node $N_1$ and the base current of the transistor PB increases. Therefore, the transistor PB turns on and a large current flows. The voltage at the input terminal IN rises at an instant to −10 to −20 V to protect the subject circuit CP to be protected.

If the circuit shown in FIG. 5 is used, the protection operation similar to the circuit shown in FIG. 2 can be performed, excepting that a forward voltage is applied across the diode $D_3$ via the resistors $R_{42}$ and $R_{41}$ and node $N_4$.

Figure 6:
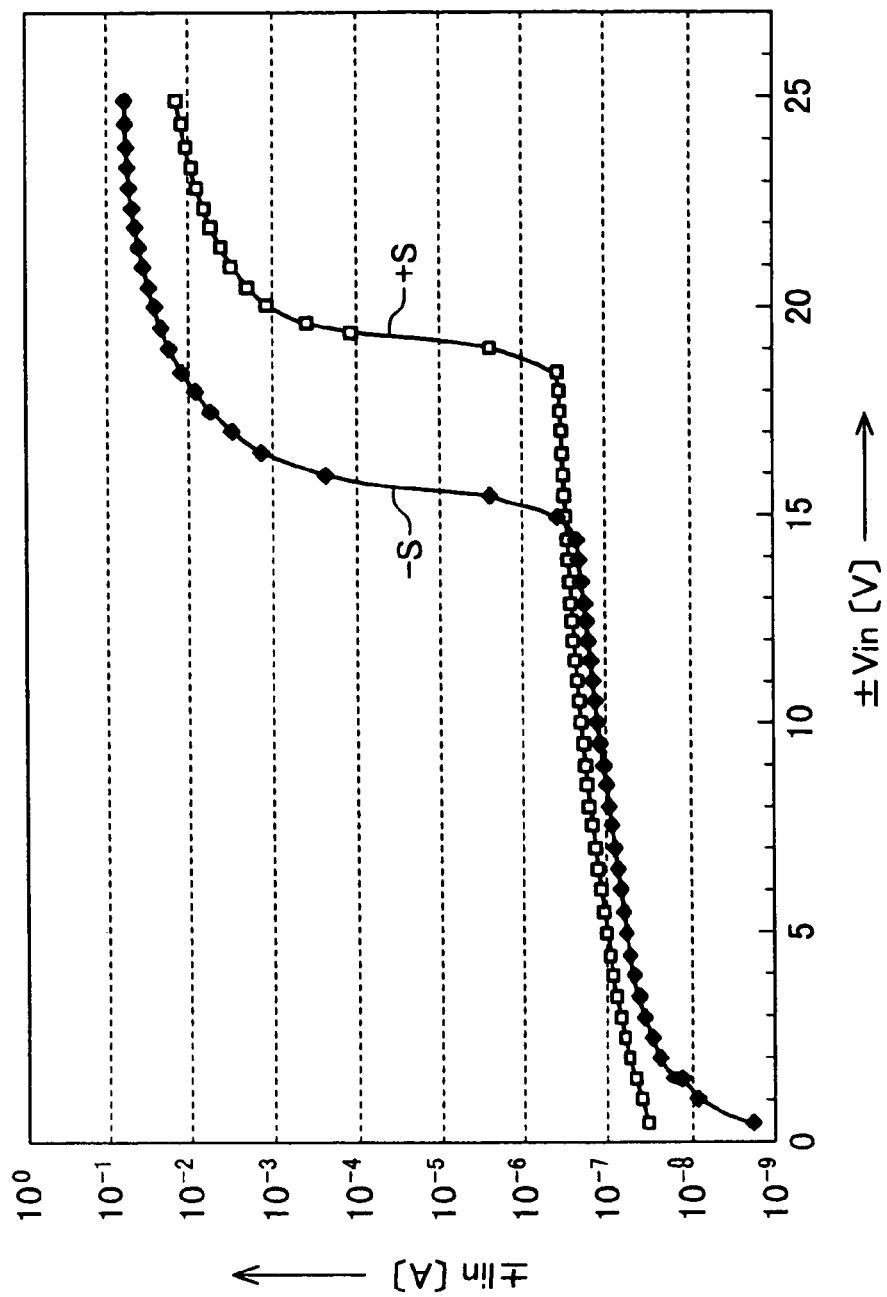
FIG. 6 is a graph showing an example of the voltage-current characteristics of the circuit shown in FIG. 1.

FIG. 6 shows an example of the voltage-current characteristics of the input protection circuit shown in FIGS. 1 and 2. A voltage applied to the input terminal IN is represented by ±Vin (V), and a current flowing through the input terminal IN upon application of the voltage ±Vin is represented by ±In (A). A curve +S shows the voltage-current characteristics at +Vin, and a curve −S shows the voltage-current characteristics at −Vin.

As shown in FIG. 6, the breakdown voltage at +Vin is about 18.5 V, and the breakdown voltage at −Vin is about 15 V. The breakdown voltage at +Vin corresponds approximately to the inverse breakdown voltage of the diode $D_3$, whereas the breakdown voltage at −Vin corresponds approximately to the inverse breakdown voltage of the diode $D_1$. The inverse breakdown voltage of the diode $D_3$ can be set as desired by the impurity dope amounts of the well regions 20 and 22 and substrate 10. For example, it can be set to about 18 to 50 V. The inverse breakdown voltage of the diode $D_1$ can be set as desired by the impurity dope amounts of the impurity doped region 14 and well region 12. For example, it can be set to about 13 to 15 V. Some audio IC is required to input a signal in the signal level range of −12.5 V to +17.5 V. Such requirements can be met sufficiently by the input protection circuit having the voltage-current characteristics shown in FIG. 6. According to the characteristics shown in FIG. 6, the leak current in the range from −12.5 V to +17.5 V has a low level smaller than 1 μA.

In the input protection circuit shown in FIGS. 1 and 2, a current limiting resistor Ri made of resistive material such as polysilicon may be formed on the insulating film 32 as shown in FIG. 1, and the input terminal IN is connected to the p+-type impurity doped region 14 (emitter of the transistor PB) via the resistor Ri as indicated by broken lines in FIG. 1. The resistor Ri limits current so that it is possible to prevent thermal breakage of circuit elements such as transistors PB and NB and diodes $D_1$ to $D_3$.

Figure 7:
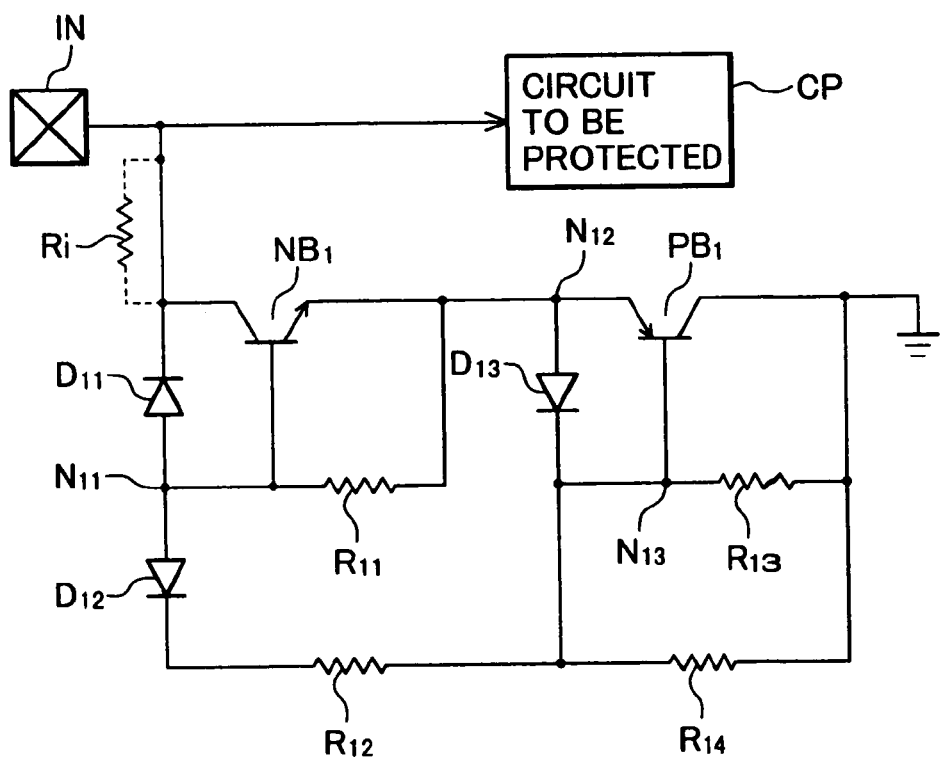
FIG. 7 is an equivalent circuit diagram showing a first modification of the integrated structure shown in FIG. 1.

FIG. 7 is an equivalent circuit diagram showing a first modification of the integrated structure shown in FIG. 1 having inverted conductivity types.

This modification shown in FIG. 7 has elements having conductivity types inverted from those of the integrated structure shown in FIG. 1. Namely, the conductivity type of the substrate 10 is changed to an n-type, the conductivity type of the well regions 12, 22 and 24 is changed to a p-type, the conductivity type of the well region 20 is changed to an n-type, the conductivity type of the impurity doped regions 14, 16 and 30 is changed to an n+-type, and the conductivity type of the impurity doped regions 18, 26 and 28 is changed to a p+-type. Therefore, the transistors PB and NB shown in FIG. 2 are changed to an NPN transistor $NB_1$ and a PNP transistor $PB_1$, the diodes $D_1$, $D_2$ and $D_3$ shown in FIG. 2 are changed to diodes $D_{11}$, $D_{12}$ and $D_{13}$ with inverted polarities. Resistors $R_{11}$, $R_{12}$, $R_{13}$ and $R_{14}$ and nodes $N_{11}$, $N_{12}$ and $N_{13}$ shown in FIG. 7 correspond to the resistors $R_1$, $R_2$, $R_3$ and $R_4$ and nodes $N_1$, $N_2$ and $N_3$ shown in FIG. 2.

In the circuit shown in FIG. 7, when an ESD input of, e.g., +2000 V is applied to the input terminal IN, a backward voltage is applied across the diode $D_{11}$. When this backward voltage exceeds the inverse breakdown voltage of the diode $D_{11}$, the backward current of the diode $D_{11}$ flows through the node $N_{11}$ and resistor $R_{11}$ and the base current of the transistor $NB_1$ increases. Therefore, the transistor $NB_1$ turns on. When an ESD input of, e.g., −2000 V is applied to the input terminal IN, the diode $D_{11}$ turns on and a backward voltage is applied across the diode $D_{13}$. In this case, the emitter and collector of the transistor $PB_1$ shown in FIG. 7 become the collector and emitter, respectively. When the voltage across the diode $D_{13}$ exceeds the inverse breakdown voltage of the diode $D_{13}$, the backward current of the diode $D_{13}$ flows through the resistor $R_{13}$ and node $N_{13}$ and the base current of the transistor $PB_1$ increases. Therefore, the transistor $PB_1$ turns on. The subject circuit CP to be protected can therefore be protected from the ESD input of ±2000 V.

In the circuit shown in FIG. 7, the positive signal level capable of being input is limited by the inverse breakdown voltage of the diode $D_{11}$, whereas the negative signal level capable of being input is limited by the inverse breakdown voltage of the diode $D_{13}$. The inverse breakdown voltage of the diode $D_{13}$ is usually higher than the inverse breakdown voltage of the diode $D_{11}$ so that a signal in the range, for example, from −50 V to +15 V can be input.

In the circuit shown in FIG. 7, the structures shown in FIGS. 4 and 5 may be applied to the transistor $PB_1$. Similar to that described with reference to FIGS. 1 and 2, a resistor Ri may be connected between the input terminal IN and the collector of the transistor $NB_1$ to limit the current and prevent thermal breakage of the circuit components such as transistors and diodes.

Figure 8:
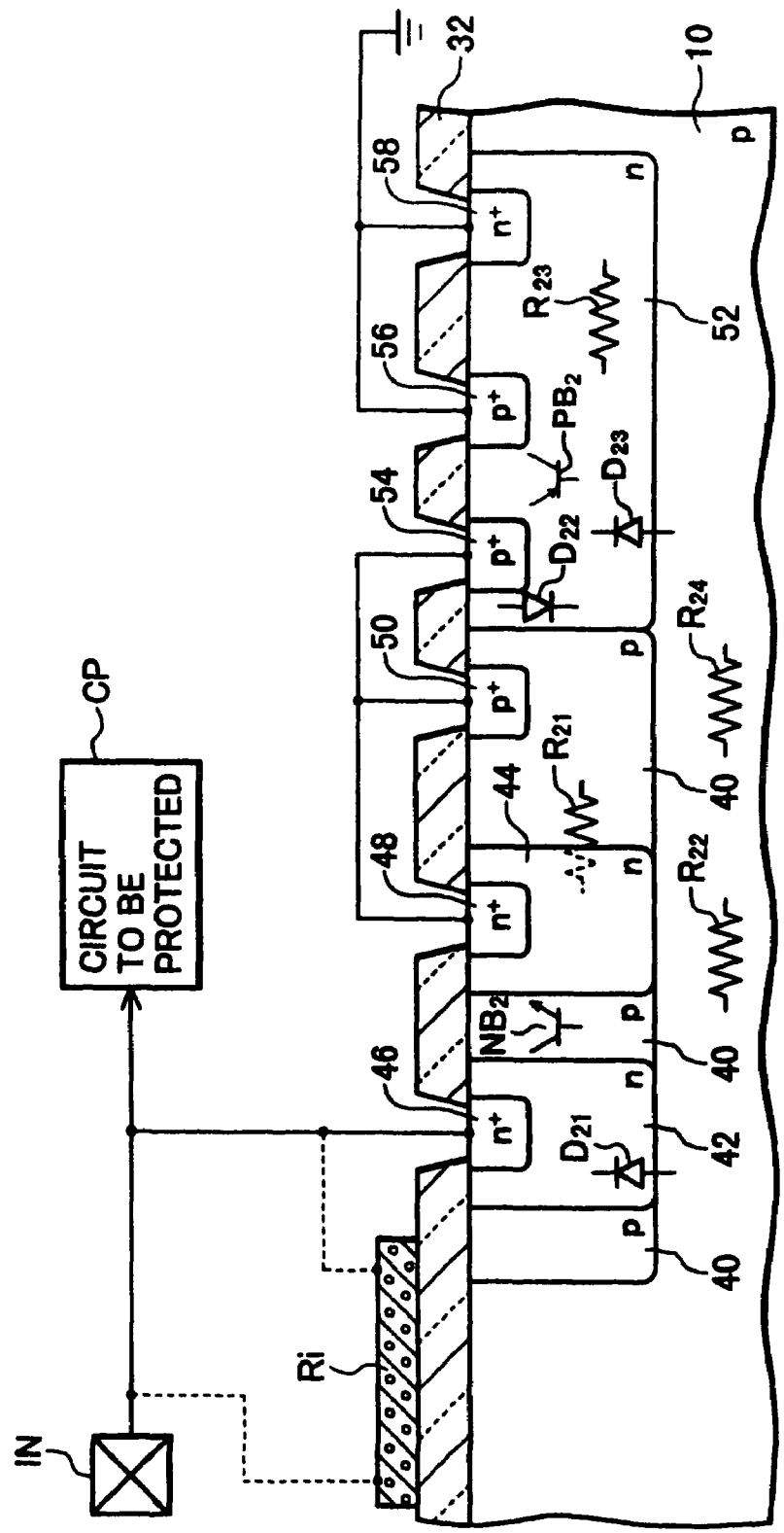
FIG. 8 is a cross sectional view of a substrate showing a second modification of the integrated structure shown in FIG. 1.

FIG. 8 shows a second modification of the integrated structure shown in FIG. 1. In FIG. 8, like elements to those shown in FIG. 1 are represented by like reference symbols.

In this modification shown in FIG. 8, the positions of the PNP transistor PB and NPN transistor NB are replaced. Namely, in one principal surface area of a p-type substrate 10, a p-type well region 40 is formed having a relatively low impurity concentration. In the well region 40, n-type well regions 42 and 44 are formed which form an NPN lateral bipolar transistor $NB_2$ with a portion of the well region 40 serving as its base. The well regions 42 and 44 have a relatively low impurity concentration and both provide a PN junction with the well region 40 and substrate 10 (or only with the well region 40). In the well regions 42 and 44, n+-type impurity doped regions 46 and 48 are formed having a relatively high impurity concentration to provide ohmic contacts. A p+-type impurity doped region 50 is formed in the well region 40 to provide an ohmic contact.

In the principal surface area of the substrate 10, an n-type well region 52 having a relatively low impurity concentration is formed having a PN junction with the substrate 10. In the well region 52, p+-type impurity doped regions 54 and 56 are formed to form a PNP lateral bipolar transistor $PB_2$ with a portion of the well region 52 serving as its base. The impurity doped regions 54 and 56 have a relatively high impurity concentration. In the well region 52, an n+-type impurity doped region 58 is formed to provide an ohmic contact.

The impurity doped region 46 is connected to the input terminal IN. The impurity doped regions 48 and 50 are connected to the impurity doped region 54. The impurity doped regions 56 and 58 are connected to the reference potential.

Figure 9:
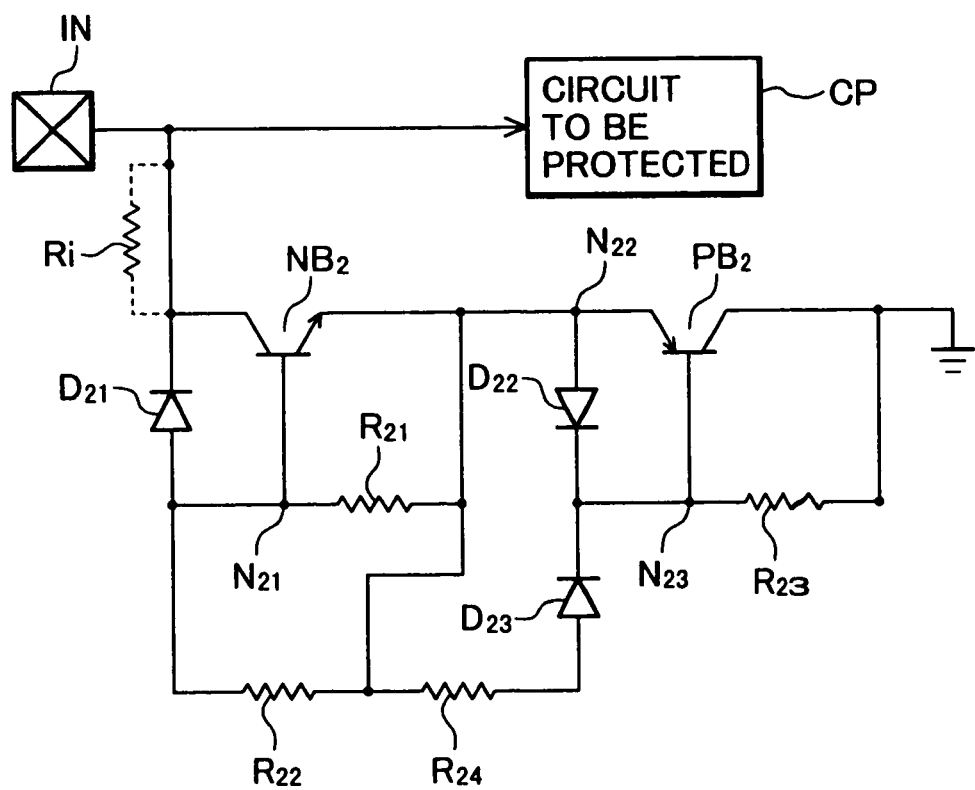
FIG. 9 is an equivalent circuit diagram of the integrated structure shown in FIG. 8.
Figure 10:
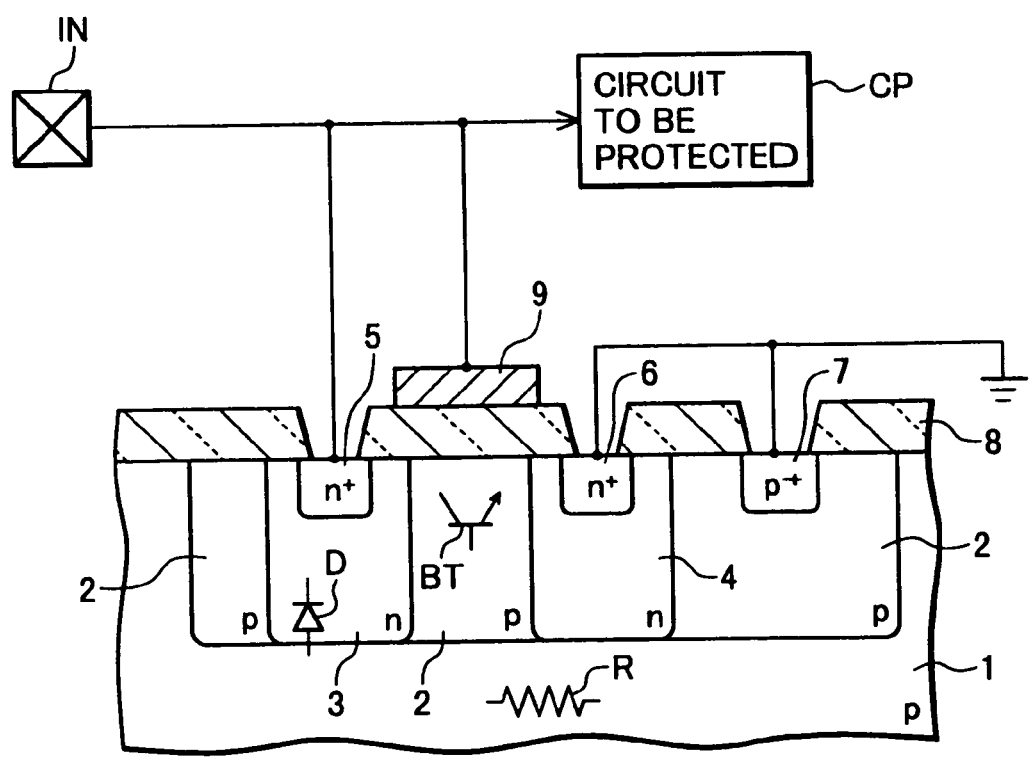
FIG. 10 is a cross sectional view showing the integrated structure of a conventional input protection circuit.
Figure 11:
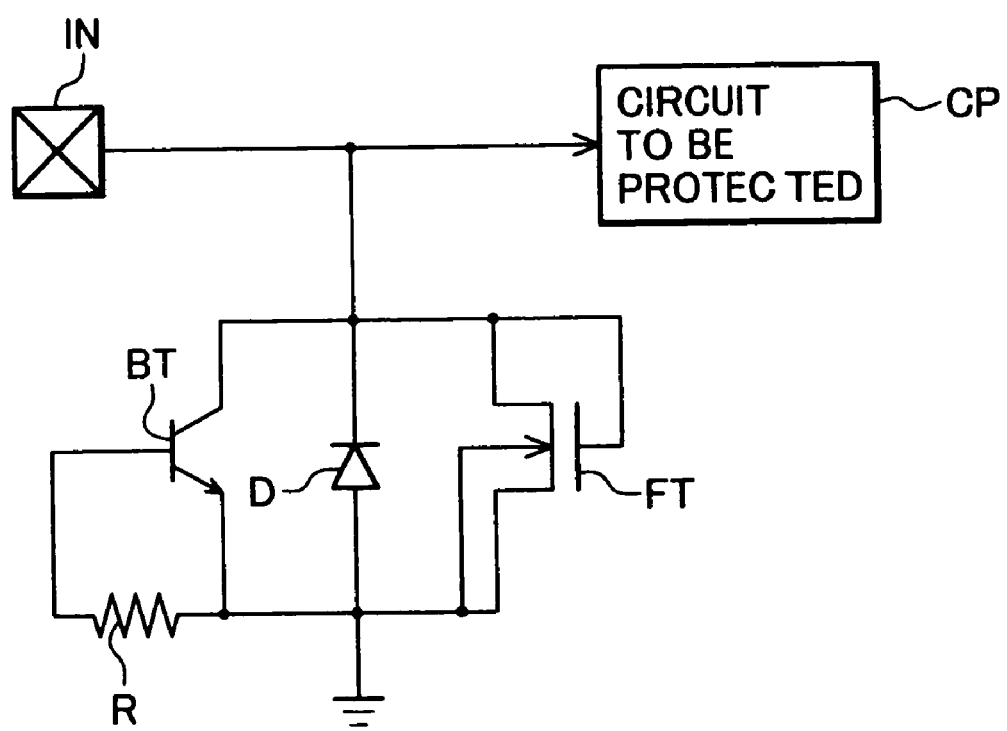
FIG. 11 is an equivalent circuit diagram of the integrated structure shown in FIG. 10.

FIG. 9 is an equivalent circuit diagram of the integrated structure shown in FIG. 8. The collector (well region 42) of the NPN transistor $NB_2$ is connected to the input terminal IN. The emitter (well region 44) of the transistor $NB_2$ is connected to the emitter (impurity doped region 54) of the PNP transistor $NB_2$, and the base of the transistor $NB_2$ is connected to the emitter of the transistor $PB_2$ via a resistor $R_{21}$ made of the resistance component of the well region 40.

A connection point between the base of the transistor $NB_2$ and the resistor $R_{21}$ is represented by a node $N_{21}$. The cathode and anode of a diode $D_{21}$ made of a PN junction between the well region 42 and well region 40 and between the well region 42 and substrate 10 are connected to the collector and base of the transistor $NB_2$, respectively.

The collector (impurity doped region 56) of the transistor $PB_2$ is connected to the reference potential, and the base of the transistor $PB_2$ is connected to the reference potential via a resistor $R_{23}$ made of the resistance component of the well region 52. The anode and cathode of a diode $D_{22}$ made of a PN junction between the impurity doped region 54 and well region 52 are connected to the emitter and base of the transistor $PB_2$, respectively. A connection point between the anode of the diode $D_{22}$ and the emitter of the transistor $PB_2$ is represented by a node $N_{22}$, and a connection point between the base of the transistor $PB_2$ and the resistor $R_{23}$ is represented by a node $N_{23}$.

A resistor $R_{22}$ made of the resistance component of the substrate 10 is connected between the anode of the diode $D_{21}$ and the node $N_{22}$. The cathode of a diode $D_{23}$ made of a PN junction between the well region 52 and substrate 10 is connected to the node $N_{23}$, and the anode of the diode $D_{23}$ is connected to the node $N_{22}$ via a resistor $R_{24}$ made of the resistance component of the substrate 10.

In the input protection circuit shown in FIGS. 8 and 9, when an ESD input of, e.g., +2000 V is applied to the input terminal IN, a backward voltage is applied across the diode $D_{21}$. When this backward voltage exceeds the inverse breakdown voltage of the diode $D_{21}$, the backward current of the diode $D_{21}$ flows through the node $N_{21}$ and resistor $R_{21}$ and the base current of the transistor $NB_2$ increases. Therefore, the transistor $NB_2$ turns on. When an ESD input of, e.g., −2000 V is applied to the input terminal IN, the diode $D_{21}$ turns on and a backward voltage is applied across the diode $D_{22}$. In this case, the emitter and collector of the transistor $PB_2$ shown in FIG. 9 become the collector and emitter, respectively. When the voltage across the diode $D_{22}$ exceeds the inverse breakdown voltage of the diode $D_{22}$, the backward current of the diode $D_{22}$ flows through the resistor $R_{23}$ and node $N_{23}$ and the base current of the transistor $PB_2$ increases. Therefore, the transistor $PB_2$ turns on. The subject circuit CP to be protected can therefore be protected from the ESD input of ±2000 V.

In the input protection circuit shown in FIGS. 8 and 9, the positive signal level capable of being input is limited by the inverse breakdown voltage of the diode $D_{21}$, whereas the negative signal level capable of being input is limited by the inverse breakdown voltage of the diode $D_{22}$. The inverse breakdown voltage of the diode $D_{21}$ is usually higher than the inverse breakdown voltage of the diode $D_{22}$ so that a signal in the range, for example, from −15 V to +50 V can be input.

In the input protection circuit shown in FIGS. 8 and 9, the structures shown in FIGS. 4 and 5 may be applied to the transistor $NB_2$. Similar to that described with reference to FIG. 7, the conductivity type inverted from that shown in FIG. 8 may be used. In this case, in the equivalent circuit shown in FIG. 9, the transistors $NB_2$ and $PB_2$ are changed to a PNP transistor and an NPN transistor, respectively, and the polarities of the diodes $D_{21}$ to $D_{23}$ are inverted. In the protection operation, for an ESD input of +V, the NPN transistor turns on, and for an ESD input of −V, the PNP transistor turns on. The signal level capable of being input can be set, for example, in the range from −50 V to +15 V. In the circuit shown in FIGS. 8 and 9, similar to that described with reference to FIGS. 1 and 2, a resistor Ri may be connected between the input terminal IN and the collector of the transistor $NB_2$ to limit the current and prevent thermal breakage of transistors and diodes.

The present invention has been described in connection with the preferred embodiments. The invention is not limited only to the above embodiments. For example, the impurity doped regions 14, 16, 54 and 56 and other impurity doped regions may be formed as deep well regions having a relatively low impurity concentration. In this case, the inverse breakdown voltage of the diodes such as the diodes $D_1$ and $D_{22}$ can be raised further and the range of the signal level capable of being input can be broadened further. In the structure shown in FIG. 4, the well regions 20, 20a and 20b may be omitted and the base region BS of the transistor NB may be made of a portion of the substrate 10. In this case, the inverse breakdown voltage of the diodes such as the diodes $D_3$ and $D_{22}$ can be raised further and the range of the signal level capable of being input can be broadened further.

What we claim are:

1. An input protection circuit comprising:
   a semiconductor substrate of a first conductivity type provided with a circuit to be protected;
   an input terminal formed above the semiconductor substrate for supplying an input signal to the circuit to be protected;
   a first well region of the first conductivity type, formed in one principal surface area of said semiconductor substrate;
   a second well region of a second conductivity type opposite to the first conductivity type, formed in the principal surface area of said semiconductor substrate, and forming a PN junction with said semiconductor substrate;
   third and fourth well regions of the second conductivity type formed in said first well region, and forming a first lateral bipolar transistor with a portion of said first well region serving as a base, the bottoms of said third and fourth well regions forming PN junctions with said first well region or with said semiconductor substrate and the third and fourth well regions not being part of a MOS transistor; and
   first and second impurity doped regions of the first conductivity type, formed in said second well region and forming a second lateral bipolar transistor with a portion of said second well region serving as a base,
   wherein said input terminal is connected to said third well region, said fourth well region and the base of said first lateral bipolar transistor are connected to said first impurity doped region, said first lateral bipolar transistor operates without a fixed base bias, and said second impurity doped region and the base of the second lateral bipolar transistor are connected to a reference potential node.

2. The input protection circuit according to claim 1, further comprising a current limiting resistor formed on an insulating layer formed in the principal surface area of said semiconductor substrate, wherein said input terminal is connected via said current limiting resistor to said third well region.

3. The input protection circuit according to claim 1, wherein the second lateral bipolar transistor is turned on to protect the circuit to be protected when a high negative bias voltage is applied to the input terminal.

4. The input protection circuit according to claim 1, wherein the first lateral bipolar transistor is turned on to protect the circuit to be protected when a high positive bias voltage is applied to the input terminal.

* * * * *